Figure 1:
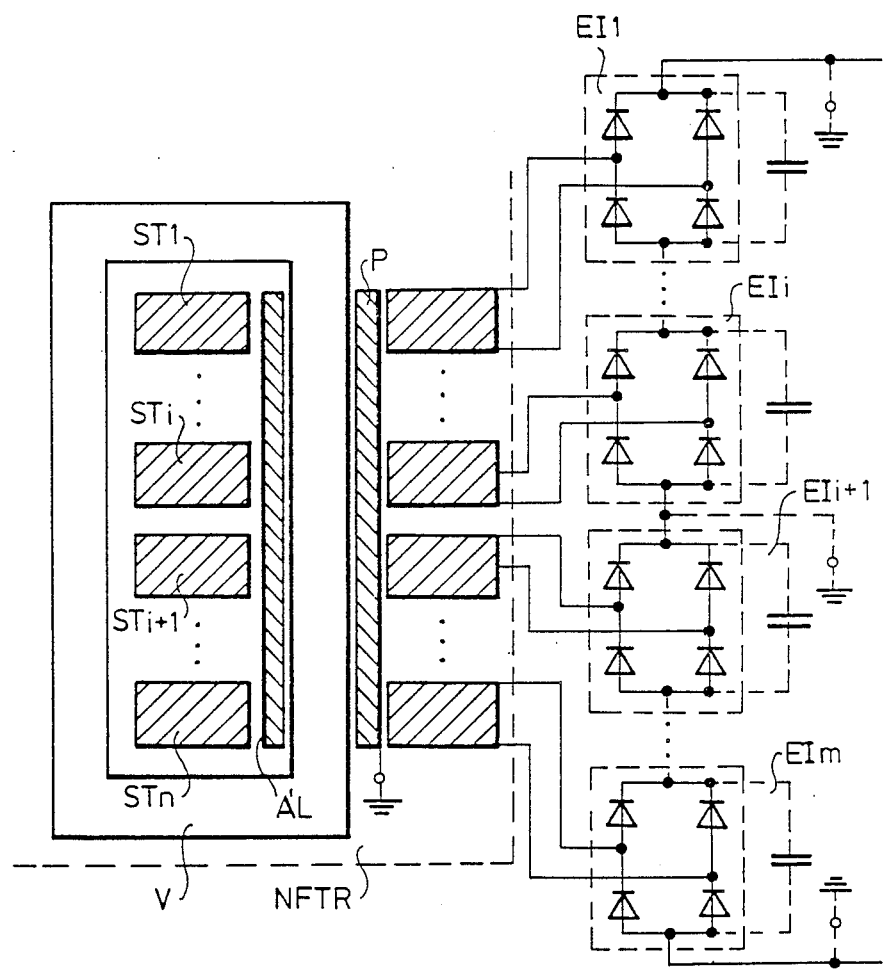

United States Patent [19]

Varjasi et al.

[11] Patent Number: 4,807,105
[45] Date of Patent: Feb. 21, 1989

[54] CIRCUIT ARRANGEMENT FOR PRODUCING HIGH DC VOLTAGE FROM MEDIUM-FREQUENCY AC VOLTAGE

[75] Inventors: Istvan Varjasi, Budapest; Gyorgy Areldt, Monor; Zoltan Gajasz, Budaors, all of Hungary

[73] Assignee: Budapesti Muszaki Egyetem, Budapest, Hungary

[21] Appl. No.: 13,828

[22] PCT Filed: May 4, 1986

[86] PCT No.: PCT/HU86/00024
§ 371 Date: Feb. 27, 1987
§ 102(e) Date: Feb. 27, 1987

[87] PCT Pub. No.: WO86/06892
PCT Pub. Date: Nov. 20, 1986

[30] Foreign Application Priority Data
May 3, 1985 [HU] Hungary ............... 1689/85

[51] Int. Cl.[4] .............................. H02M 7/10
[52] U.S. Cl. .................... 363/68; 363/126; 336/180
[58] Field of Search ............... 363/68, 126; 336/180, 336/182; 378/104; 361/400, 412, 388; 357/77

[56] References Cited
U.S. PATENT DOCUMENTS

| | | | |
|---|---|---|---|
| 4,099,510 | 7/1978 | Perrier et al. | 336/178 X |
| 4,227,143 | 10/1980 | Elders et al. | 363/126 X |
| 4,323,781 | 4/1982 | Baumann et al. | 336/120 X |
| 4,394,722 | 7/1983 | Nero | 363/68 |

FOREIGN PATENT DOCUMENTS
2045012 10/1980 United Kingdom ............... 363/68

OTHER PUBLICATIONS
Southworth et al., "Modular Power Supply", IBM Technical Disclosure Bulletin, Dec. 1978, pp. 2622–2623.

Primary Examiner—Patrick R. Salce
Assistant Examiner—Kristine Peckman
Attorney, Agent, or Firm—Young & Thompson

[57] ABSTRACT

A circuit arrangement consists of one or several high voltage transformers and rectifier systems usable advantageously for the step-up transformation of medium frequency voltages, for rectification, and smoothing. With the use of the circuit arrangement according to this invention, systems can be built up having small dimensions and low weight, and usable as high voltage supply units providing low standing wave ratio and good dynamic properties. The secondary winding of the high voltage transformer exhibits a flat arrangement. Electrically connected winding systems are designed from the secondary flat windings (flat windings of a predetermined number are connected in series). The resultant AC voltage of the individual, electrically coupled winding systems is connected to the component rectifiers. The component rectifiers are series-connected on the DC side. In one advantageous embodiment of the solution according to this invention, polypropylene or polyethylene is utilized as a basic material for the flat winding coil forms and the layer insulation.

3 Claims, 3 Drawing Sheets

CIRCUIT ARRANGEMENT FOR PRODUCING HIGH DC VOLTAGE FROM MEDIUM-FREQUENCY AC VOLTAGE

In order to be able to reduce radiation stress on a patient, present-day X-ray technique requires that the tube voltage exhibit, in the stationary condition, a low standing wave ratio while the pulse rise time and pulse decay time of the tube voltage are to be brief as compared with the exposure time. At the same time, there is the requirement of small dimensions and low weight (single-tank design, movable X-ray machines); also desirable are a relatively low uptake of supply current from the mains, storage-battery operation, and low acoustic noise. The aforementioned requirements can be satisfied in the majority of cases by means of correspondingly controlled medium frequency converters. However, the use of medium frequency brings numerous, heretofore unknown problems. The problems inherent in constructing the system of high voltage transformer and rectifier are of extreme importance among the problems to be solved. With an increasing frequency, the charging currents are increased which are determined by the capacitances of the secondary winding system. This increase leads to overload of the drive generator, of the high voltage transformer; local hot spots can be observed in connection with the transformer. New problems are likewise encountered in solving the insulating tasks since the behavior of the insulating materials in the medium frequency force field as well as the creeping distances along the interface have not as yet been entirely explained.

As a consequence of the aforementioned effects, the posed problem cannot be solved satisfactorily either with regard to technology or economy with the use of the conventional transformer and rectifier arrangements; thus, the advantages of medium frequency techniques cannot be exploited as effectively as desired.

At present, X-ray generators are built primarily for operation with mains frequency. One design with higher frequency is represented, for example, by the X-ray generator type EDX 100 (manufacturer: Medicor), but this generator operates at a frequency of 400 Hz; therefore, the advantages enumerated in the foregoing, as inherent in the medium frequency (low standing wave ratio, low weight, small dimensions, etc.), are not as yet realized.

Medium frequency solutions are likewise known. Worth mentioning are the products of the company SIEMENS, such as, for example, the X-ray generators "Polyhos 30 M", "Polydoros 50", "Mobilett". The frequency employed (about 5 kHz), the power-oriented electrical solution, the pulse group control, and the power range selected make it possible to include the transformer and rectifier of the X-ray generator in a structural arrangement that can still be considered as conventional. In general, the secondary high-voltage winding is subdivided into two parts, and a design with two transformers is also frequently used, and the two AC voltages are individually rectified. The two rectified voltages are connected in series, and the positive and negative rectifier output forming the center is grounded.

In classical X-ray technique, this arrangement is, on the one hand, based on reasons of insulating technique; on the other hand, measurement of the tube current is made possible subsequent to this point. The static (standing wave) and dynamic characteristics of the wave form of the tube voltage in this apparatus fall significantly behind the similar characteristics in X-ray generators realizable with the present-day transistor technology. This is so because, using the present power transistors, the X-ray generator operating in a range of between 10 and 20 kHz can be realized in a relatively economical fashion; the tube voltage wave form of this generator exhibits even in the single-tank design 12 pulses; at the same time, the rise times and decay times of the tube voltage pulses are brief. This frequency range requires, however, a novel construction of the high voltage transformer and rectifier. The essential aspect of the solution according to this invention is based on the following realizations:

By designing the secondary winding system as a flat winding, and reducing the distributed capacitance of the flat winding system to the ends of the winding system, the thus-reduced, resultant capacitance in dependence on the secondary coil form number is at a minimum.

By using polypropylene or polyethylene as the basic material for the coil forms and the insulating layer, and by providing the coil forms with paper bands, it is possible to obtain in the transformer a favorable potential distribution (the dielectric constants of the oil and of polypropylene are approximately the same, and the transient voltage characteristics of the interface of oil-polypropylene are extremely favorable).

By utilizing, per coil form or per coil form group, series-connected component rectifiers, the body capacitances of the coil forms, which are rather significant and can be reduced even with respect to the structure only with difficulties, are practically charged at DC voltage whereby the continuous recharging in the static condition and the thereby required, high capacitive charging current become unnecessary.

Finally, the body capacitances connected in parallel with the load reduce the standing wave ratio of the tube voltage.

The use of component rectifiers also renders the voltage distribution of the diodes uniform. If, now, component rectifiers are utilized in sufficient number, then the use of a single high voltage diode in component rectifier branches is adequate thus obviating the necessity for using expensive diode chains made up of the avalanche type.

Due to the use of the component rectifiers, the homogeneous voltage distribution among the high voltage windings of the transformer is ensured extensively even in the dynamic condition.

When using filter capacitors as component rectifiers, the problems, connected with voltage distribution, of filter capacitor batteries to be composed of series-connected capacitors are eliminated.

Component rectifiers are used, a larger proportion of the medium frequency voltage, placing a stress on the insulation of the transformer, can be converted into DC voltage by increasing the number of coil forms. In this way, the problems connected with medium frequency insulation, which nowadays are still unexplained for the largest part, can be avoided in the majority of cases.

With the aid of the half-bridge rectifiers, arranged on circuit boards with parallel-extending surfaces, and with the aid of the insulating deflector panels arranged therebetween, a high voltage rectifier can be built up which is of a compact structure and adapts well to the transformer construction.

Figure 2:
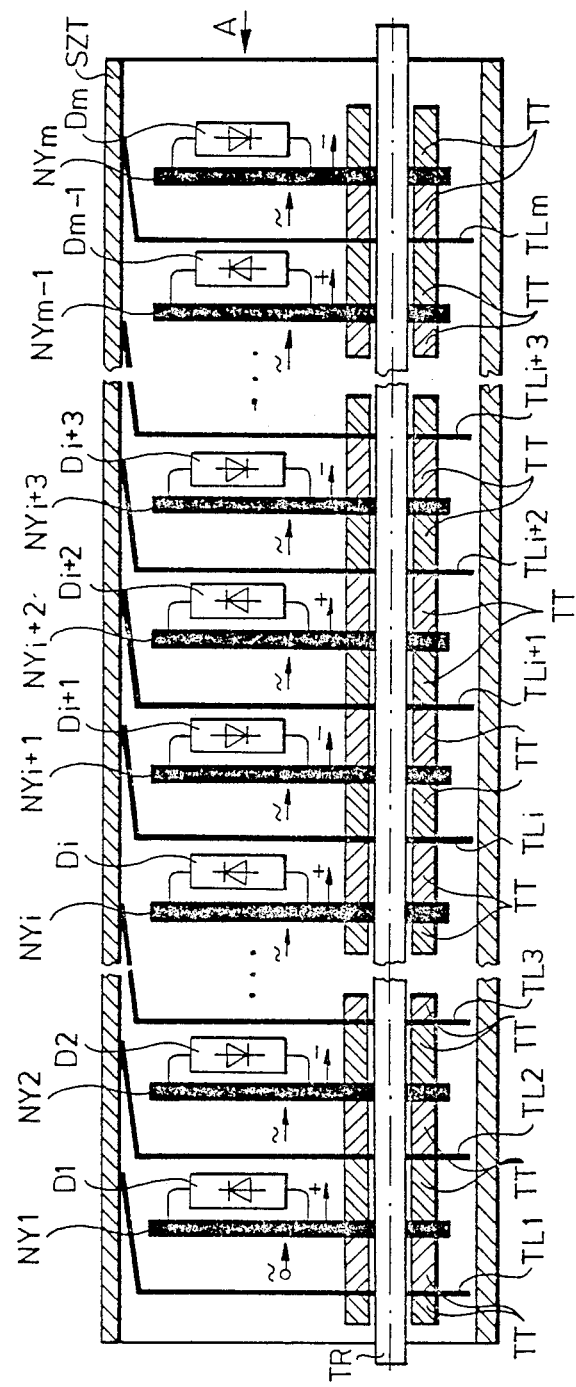
Figure 3:
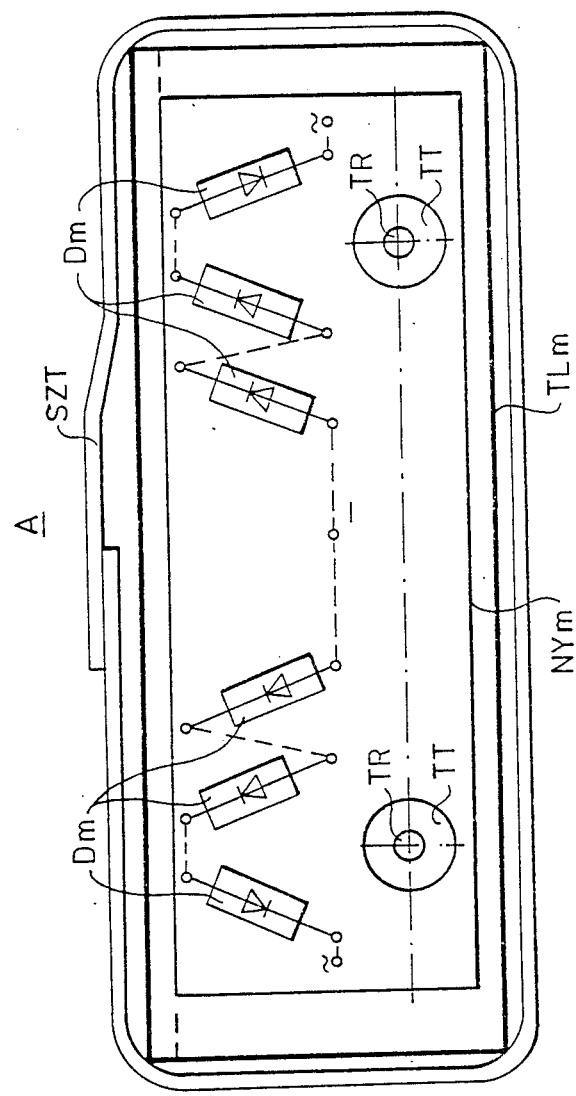

The essential aspects of the invention will be described in greater detail with reference to the appended figures wherein:

FIG. 1 shows the arrangement of the high voltage transformer and of the rectifier, FIG. 2 shows an advantageous embodiment of the arrangement of the high voltage rectifier, FIG. 3 is a view in the direction of the arrow "A" of FIG. 2.

The essential aspect of the solution according to this invention resides in a circuit arrangement containing a high voltage transformer and rectifier wherein the secondary winding system consists of n secondary flat windings electrically separated from the primary winding. These flat windings form m galvanically coupled winding systems (m = n, and m = 3), for example in such a way that, within respectively one electrically connected winding system, only a single secondary flat winding is utilized, or 1, 2 ... k secondary flat windings are connected in series. The output terminals of the electrically connected winding systems are connected to the inputs of respectively one uncontrolled rectifier. The outputs of the (diode-containing) rectifiers are series-connected in such a way that the rectified voltages are added up. The positive and, respectively, negative output terminals of the thus-obtained, series-connected rectifier system, or one of the central points of the output, are grounded directly or by means of an impedance (current-sensing element). The central point grounding is utilized in solutions with one transformer, whereas grounding of the positive and, respectively, negative output terminals is used in case of the solution constructed with two transformers. (Filter circuits or filter capacitors are connected to the output terminals of the series-connected rectifier system and/or to the output terminals of the component rectifiers.)

An advantageous embodiment of the above-mentioned arrangement is illustrated in FIG. 1. The iron core V of the high voltage transformer NFTR is designed as a shell type, the interiorly arranged primary winding P is arranged in cylinder configuration; above the cylindrically arranged primary winding P, a grounded, concentric shielding panel A'L is provided. This grounded, concentrically arranged shielding panel A'L is surrounded by n secondary flat windings ST1 .. . STi+1 arranged side-by-side along the shell. From the secondary flat windings, a number of m electrically coupled winding systems are designed. The rectifiers El1 ... Eli, Eli+1 ... Elm, which adjoin the outputs of the electrically connected winding systems, are single-phase bridge rectifiers. In the embodiment having oil insulation, the basic material chosen for the secondary flat windings and the series insulation is polypropylene or polyethylene. The dielectric constant approaches that of the oil; the force field distribution is favorable; the transient voltage characteristics at the oil-polypropylene or oil-polyethylene interface are likewise advantageous. The secondary flat windings are wound singly or in pairs.

A suitable embodiment of the rectifier arrangement of FIG. 1 is illustrated in FIGS. 2 and 3. The two diodes D1 ... Dm or two series-connected diode chains D1 ... Dm, forming the single-phase bridge rectifier with a positive or negative DC output terminal and with two AC input terminals, are arranged on the circuit board strips NY1 ... NYm in such a way that the two AC inputs are located at the two opposite edges the circuit board strips NY1 ... NYm whereas the positive or negative DC output terminal lies in the center of the circuit board strips. The circuit board strips NY1 ... NYm of the single-phase half-bridge rectifiers (Gratz circuit) are threaded onto insulating mounting rods TR with the aid of the bores formed in the strips, in alternation with the interposition of an insulating deflector panel TL inserted between respectively two insulating spacer rings TT, in such a way that the surfaces of the circuit board strips NY1 ... NYm and of the insulating deflector panels TL1 ... TLm extend perpendicularly on the insulating mounting rods. The sides of the threaded-on circuit board strips NY1 ... NYm hug the shell of an imaginary contacting prism, the axis of which lies in parallel with the insulating mounting rods TR. The insulating deflector panels arranged between the circuit board strips NY1 ... NYm—the surface area of these panels exceeding that of the circuit board strips—are curved on one side at the level of the rim of the circuit strips NY1 ... NYm in the same direction; at the threading sites, their plane stands perpendicularly on the insulating mounting rods. The lateral edges of the imaginary prism encompassing the insulating deflector panels TL1 ... TLm extend in parallel with the lateral edges of the contacting prism encompassing the circuit board strips.

The curved portions of the insulating deflector panels TL1 ... TLm are to be of such a length that they extend to the subsequent deflector panel. The thus-constructed rectifier system is located in a housing projecting past the outermost circuit board strips NY1 ... NYm and having an axis extending in parallel to the insulating mounting rods TR.

We claim:

1. A circuit arrangement for producing high DC voltage from medium frequency AC voltage, comprising a high voltage transformer and a rectifier system, said high voltage transformer having a primary winding and n secondary flat windings electrically separated from the primary winding, said primary and secondary windings being arranged on a common shell-type iron core, said secondary windings forming m electrically coupled winding systems, said primary winding being arranged in a cylindrical configuration and a concentric shielding panel being provided above the cylindrically configured primary winding, said panel being surrounded by said n secondary flat windings arranged side-by-side along the shell and forming said m electrically connected winding systems, each said electrically connected winding system having an output terminal connected to respectively one input of an uncontrolled component single-phase half-bridge rectifier comprised by said rectifier system, each said component rectifier having an output connected in series to provide added rectified voltages, said rectifier system having a positive output, a negative output, and an output intermediate said positive and negative outputs, one of said positive, negative and intermediate outputs being grounded, said outputs of said rectifier system being joined to filter means.

2. A circuit arrangement for producing high DC voltage from medium frequency AC voltage, comprising a high voltage transformer and a rectifier system, said high voltage transformer comprising series insulation, a primary winding and n secondary flat windings electrically separated from the primary winding, said primary and secondary windings being arranged on a common iron core, said secondary windings being supported on coil forms, said coil forms and said series insulation being formed of one of polypropylene and polyethylene, said secondary windings forming m electrically coupled winding systems, each said electrically connected winding system having an output terminal connected to respectively one input of an uncontrolled component rectifier comprised by said rectifier system, each said component rectifier having an output connected in series to provide added rectified voltages, said rectifier system having a positive output, a negative output, and an output intermediate said positive and negative outputs, one of said positive, negative and intermediate outputs being grounded, said outputs of said rectifier system or said outputs of said component rectifiers being joined to filter means.

3. A circuit arrangement for producing high DC voltage from medium frequency AC voltage, comprising a high voltage transformer and a rectifier system, said high voltage transformer having a primary winding and n secondary flat windings electrically separated from the primary winding, said primary and secondary windings being arranged on a common shell-type iron core, said secondary windings forming m electrically coupled winding systems, said primary winding being arranged in a cylindrical configuration and a concentric shielding panel being provided above the cylindrically configured primary winding, said panel being surrounded by said n secondary flat windings arranged side-by-side along the shell and forming said m electrically connected winding systems, each said electrically connected winding system having an output terminal connected to respectively one input of an uncontrolled component single-phase half-bridge rectifier comprised by said rectifier system, each said component rectifier having an output connected in series to provide added rectified voltages, said rectifier system having a positive output, a negative output, and an output intermediate said positive and negative outputs, one of said positive, negative and intermediate outputs being grounded, said outputs of said rectifier system being joined to filter means, said single-phase half-bridge rectifier comprising a chain of two diodes and having a DC output and two AC inputs and being arranged on a circuit board strip, the two AC inputs being located on opposite edges of said circuit board strip, and the DC output being located in the center of the circuit board strip; said circuit board strip containing a bore, with the aid of which the circuit board strip is threaded onto mounting rods made up of an insulating material, with the interposition of an insulating deflector panel between respectively two insulating spacer rings, in such a way that said circuit board strip defines a periphery of an imaginary contacting prism, said prism, said prism having an axis parallel with said mounting rods; insulating deflector panels located adjacent said circuit board strip, said panels being larger than said circuit board strip and each having one side curved toward said circuit board strip, each said panel being disposed perpendicularly to said mounting rods; said rectifier system having an axis which extends parallel with the insulating mounting rods, and being enclosed by a housing.

* * * * *